(12) United States Patent
Maruyama

(10) Patent No.: US 6,639,445 B2
(45) Date of Patent: Oct. 28, 2003

(54) SEMICONDUCTOR INTEGRATED CIRCUIT

(75) Inventor: Akira Maruyama, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/216,065

(22) Filed: Aug. 9, 2002

(65) Prior Publication Data

US 2003/0030477 A1 Feb. 13, 2003

(30) Foreign Application Priority Data

Aug. 10, 2001 (JP) ........................................ 2001-244854

(51) Int. Cl.⁷ .......................................... H03K 19/0185
(52) U.S. Cl. ........................................ 327/333; 327/103
(58) Field of Search ................................ 327/333, 103, 327/77, 534, 537; 326/80, 81; 323/315

(56) References Cited

U.S. PATENT DOCUMENTS 4,713,600 A  * 12/1987 Tsugaru et al. ............. 327/333
6,066,975 A  *  5/2000 Matano ...................... 327/333

OTHER PUBLICATIONS

Jinzai, US patent application Publication No. US 2002/0039042, Apr. 4, 2002, Ser. No. 09/955,195 filed Sep. 19, 2001.*

* cited by examiner

*Primary Examiner*—Toan Tran
(74) *Attorney, Agent, or Firm*—Harness, Dickey & Pierce, P.L.C.

(57) ABSTRACT

The gate terminals of several Pch transistors are connected to an output terminal and controlled with second and third potentials. The gate terminals of several Nch transistors are connected to the output terminal and controlled with first and fourth potentials. In this way, an input signal between a VDD potential and a GND potential can be level-shifted to an output signal between a VPP potential and a VBB potential with a simple circuit structure. Also, the operation speed in switching potentials can be improved.

6 Claims, 1 Drawing Sheet

SEMICONDUCTOR INTEGRATED CIRCUIT

BACKGROUND OF THE INVENTION

1. Technical Field of the Invention

The present invention relates to level shifter circuits in semiconductor integrated circuits.

2. Conventional Technology

FIG. 2 shows a level shifter of a conventional example.

In FIG. 2, an inverter circuit 20 is composed of a Pch transistor 23 and an Nch transistor 28, a level shifter circuit 21 is composed of Pch transistors 24 and 25 and Nch transistors 29 and 30, and a level shifter circuit 22 is composed of Pch transistors 26 and 27 and Nch transistors 31 and 32. In here, the inverter circuit 20 is connected between a VDD potential and a GND potential. The level shifter circuit 21 is connected between a VPP potential that is higher than the VDD potential and the GND potential. The level shifter circuit 22 is connected between the VPP potential and a VBB potential that is lower than the GND potential.

An operation of the above is described.

When a potential of an input signal is at the VDD potential, the Nch transistor 29 turns off and the Nch transistor 30 turns on, such that a node 35 shifts to the GND potential and a node 34 shifts to the VPP potential. In response thereto, the Pch transistor 26 turns off and the Pch transistor 27 turns on, such that a node 36 shifts to the VBB potential and an output shifts to the VPP potential. In this case, as the Pch transistors 23 and 25 and the Nch transistor 32 are turned off, no through current flows in five paths among the power supplies.

Next, when a potential of an input signal is at the GND potential, the Nch transistor 29 turns on and the Nch transistor 30 turns off, such that the node 34 shifts to the GND potential and the node 35 shifts to the VPP potential. In response thereto, the Pch transistor 26 turns on and the Pch transistor 27 turns off, such that the node 36 shifts to the VPP potential and an output shifts to the VBB potential. In this case, as the Pch transistor 24 and the Nch transistors 28 and 31 are turned off, no through current flows in the five paths among the power supplies.

In this manner, input signals between the VDD potential and the GND potential can be level-shifted to output signals between the VPP potential and the VBB potential.

In the conventional technology described above, the circuit structure is particularly complex, and therefore a problem exists in that there are restrictions in terms of layout particularly when the circuit is used as a driving circuit for word lines in flash memories and dynamic memories.

The present invention solves such problems, and one object is to provide a structure for level shifters which simplifies complex circuit structures and is not constrained by the layout.

SUMMARY OF THE INVENTION

A semiconductor integrated circuit in accordance with the present invention converts input signals composed of first and second power supply potentials to output signals composed of third and fourth power supply potentials. The semiconductor integrated circuit comprises: first, second and third Pch transistors and first, second and third Nch transistors, wherein a first terminal of the first Pch transistor connects to the third power supply potential, a first terminal of the second Pch transistor connects to the third power supply potential, a first terminal of the third Pch transistor connects to the first power supply potential, a first terminal of the first Nch transistor connects to the second power supply potential, a first terminal of the second Nch transistor connects to the fourth power supply potential, a first terminal of the third Nch transistor connects to the fourth power supply potential, a second terminal of the first Pch transistor connects to a second terminal of the first Nch transistor, a second terminal of the second Pch transistor connects to a second terminal of the second Nch transistor, a second terminal of the third Pch transistor connects to a second terminal of the third Nch transistor, a gate terminal of the first Pch transistor connects to the second terminal of the second Pch transistor, a gate terminal of the second Pch transistor connects to the second terminal of the first Pch transistor, a gate terminal of the third Pch transistor connects to an input terminal, a gate terminal of the first Nch transistor connects to the input terminal, a gate terminal of the second Nch transistor connects to the second terminal of the third Pch transistor, a gate terminal of the third Nch transistor connects to the second terminal of the second Pch transistor, and the second terminal of the second Pch transistor is an output terminal.

With the construction described above, the gate terminals of the Pch transistors that are connected to an output terminal are controlled with the second and third potentials, and the gate terminals of the Nch transistors that are connected to the output terminal are controlled with the first and fourth potentials, such that the circuit structure can be simplified.

DETAILED DESCRIPTION OF THE PREFERRED EMBODIMENT OF THE PRESENT INVENTION

Figure 1:
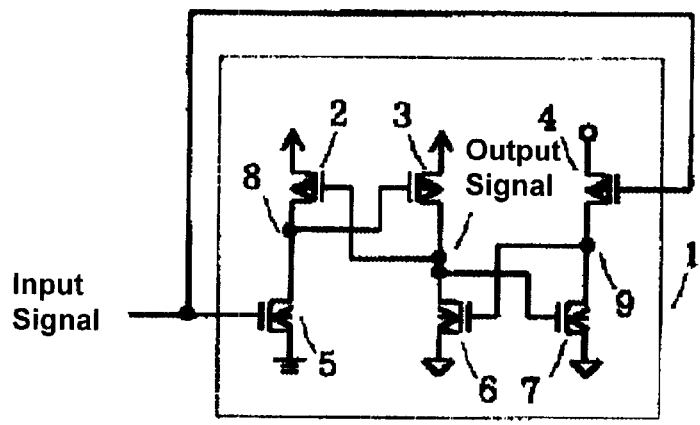
FIG. 1 shows a circuit diagram of a semiconductor integrated circuit in accordance with an embodiment of the present invention.
Figure 2:
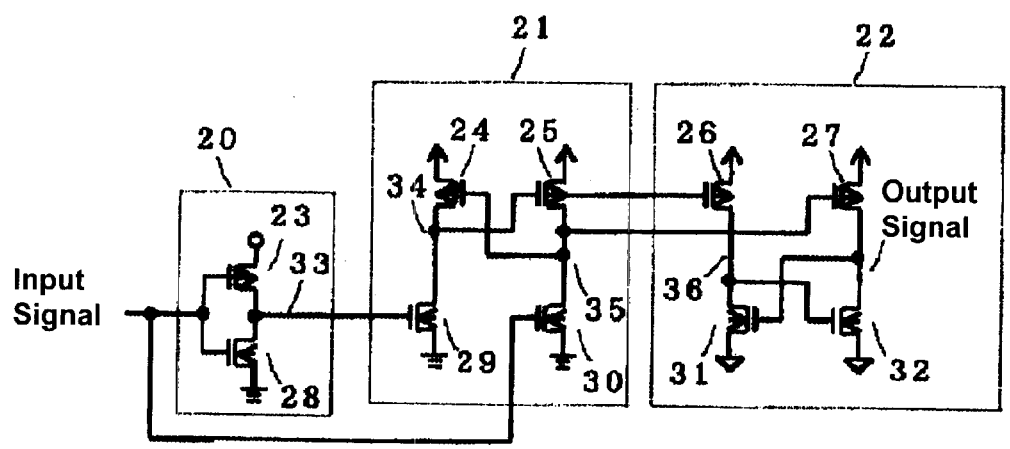
FIG. 2 shows a circuit diagram of a semiconductor integrated circuit of a conventional example.

FIG. 1 shows a circuit diagram of a semiconductor integrated circuit in accordance with one embodiment of the present invention.

A level shifter 1 shown in FIG. 1 is composed of Pch transistors 2–4 and Nch transistors 5–7. Sources of the Pch transistors 2 and 3 are connected to a VPP potential, a source of the Pch transistor 4 is connected to a VDD potential, a source of the Nch transistor 5 is connected to a GND potential, and sources of the Nch transistors 6 and 7 are connected to a VBB potential.

An operation thereof is described.

When a potential of an input signal is at the VDD potential, the Nch transistor 5 turns on, and a node 8 shifts to the GND potential. In response thereto, the Pch transistor 3 turns on, and the output shifts to the VPP potential. Meanwhile, the Pch transistor 4 is turned off, and therefore the Nch transistor 7 is turned on and a node 9 shifts to the VBB potential, and the Nch transistor 6 is turned off, and at the same time the Pch transistor 2 is turned off. As a result, the VPP potential can be output against an input of the VDD potential. In this case, each of the Pch transistors 2 and 4, and the Nch transistor 6 is turned off, and no through current flows in paths among the three power supplies.

Next, when a potential of an input signal is at the GND potential, the Pch transistor 4 turns on, and a node 9 shifts to the VDD potential. In response thereto, the Nch transistor 6 turns on, and the output shifts to the VBB potential. Meanwhile, the Nch transistor 5 is turned off, and therefore the Pch transistor 2 is turned on and a node 8 shifts to the VPP potential, and the Pch transistor 3 is turned off, and at the same time the Nch transistor 7 is turned off. As a result, the VBB potential can be output against an input of the GND potential. In this case, each of the Pch transistors 3, and the Nch transistors 5 and 7 is turned off, and no through current flows in paths among the three power supplies.

In this manner, an input signal between the VDD potential and the GND potential can be level-shifted to an output signal between the VPP potential and the VBB potential.

As described above, in accordance with the present invention, an input signal between the VDD potential and the GND potential can be level-shifted to an output signal between the VPP potential and the VBB potential with a simple circuit structure.

Also, when the transistor capacity of the Nch transistor 5 is set substantially large as compared to that of the Pch transistor 2, and the transistor capacity of the Pch transistor 4 is set substantially large as compared to that of the Nch transistor 7, the operation speed in switching potentials can be improved, which is particularly beneficial when they are used as word line driving circuits in flash memories and dynamic memories.

The entire disclosure of Japanese patent application number 2001-244854 filed Aug. 10, 2001 is hereby incorporated by reference.

What is claimed is:

1. A semiconductor integrated circuit that converts input signals composed of first and second power supply potentials to output signals composed of third and fourth power supply potentials, the semiconductor integrated circuit comprising:

first, second and third Pch transistors and first, second and third Nch transistors, wherein:

a first terminal of the first Pch transistor connects to the third power supply potential;

a first terminal of the second Pch transistor connects to the third power supply potential;

a first terminal of the third Pch transistor connects to the first power supply potential;

a first terminal of the first Nch transistor connects to the second power supply potential;

a first terminal of the second Nch transistor connects to the fourth power supply potential;

a first terminal of the third Nch transistor connects to the fourth power supply potential;

a second terminal of the first Pch transistor connects to a second terminal of the first Nch transistor;

a second terminal of the second Pch transistor connects to a second terminal of the second Nch transistor;

a second terminal of the third Pch transistor connects to a second terminal of the third Nch transistor;

a gate terminal of the first Pch transistor connects to the second terminal of the second Pch transistor;

a gate terminal of the second Pch transistor connects to the second terminal of the first Pch transistor;

a gate terminal of the third Pch transistor connects to an input terminal;

a gate terminal of the first Nch transistor connects to the input terminal;

a gate terminal of the second Nch transistor connects to the second terminal of the third Pch transistor;

a gate terminal of the third Nch transistor connects to the second terminal of the second Pch transistor; and the second terminal of the second Pch transistor is an output terminal.

2. The circuit of claim 1 wherein said third power supply potential further comprises a VPP potential.

3. The circuit of claim 1 wherein said first power supply potential further comprises a VDD potential.

4. The circuit of claim 1 wherein said second power supply potential further comprises a GND potential.

5. The circuit of claim 1 wherein said fourth power supply potential further comprises a VBB potential.

6. A semiconductor integrated circuit comprising:

first, second, and third Pch transistors and first, second, and third Nch transistors, wherein:

sources of the first and second Pch transistors are connected to a VPP potential;

a source of the third Pch transistor is connected to a VDD potential;

a source of the first Nch transistor is connected to a GND potential;

sources of the second and third transistors are connected to a VBB potential;

a second terminal of the first Pch transistor connects to a second terminal of the first Nch transistor;

a second terminal of the second Pch transistor connects to a second terminal of the second Nch transistor;

a second terminal of the third Pch transistor connects to a second terminal of the third Nch transistor;

a gate terminal of the first Pch transistor connects to the second terminal of the second Pch transistor;

a gate terminal of the second Pch transistor connects to the second terminal of the first Pch transistor;

a gate terminal of the third Pch transistor connects to an input terminal;

a gate terminal of the first Nch transistor connects to the input terminal;

a gate terminal of the second Nch transistor connects to the second terminal of the third Pch transistor;

a gate terminal of the third Nch transistor connects to the second terminal of the second Pch transistor; and the second terminal of the second Pch transistor is an output terminal.

* * * * *